(12) United States Patent
Sprouse et al.

(10) Patent No.: US 7,898,091 B2
(45) Date of Patent: Mar. 1, 2011

(54) MULTI-HOST INTERFACE CONTROLLER WITH USB PHY/ANALOG FUNCTIONS INTEGRATED IN A SINGLE PACKAGE

(75) Inventors: Steven T. Sprouse, San Jose, CA (US); Dhaval Parikh, Santa Clara, CA (US); Michael McCarthy, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 480 days.

(21) Appl. No.: 11/906,582

(22) Filed: Oct. 2, 2007

(65) Prior Publication Data

US 2009/0085221 A1    Apr. 2, 2009

(51) Int. Cl.
*H01L 23/48* (2006.01)

(52) U.S. Cl. .............. 257/777; 257/686; 257/E25.005; 257/E25.006; 257/E25.013; 257/E25.021; 257/E25.027; 257/E23.085

(58) Field of Classification Search ................. 257/685, 257/686, 723, 777, E25.055, E25.006, E25.021, 257/E25.027, E23.085
See application file for complete search history.

(56) References Cited

U.S. PATENT DOCUMENTS

| | | | | |
|---|---|---|---|---|
| 6,414,384 | B1 * | 7/2002 | Lo et al. | 257/685 |
| 6,492,727 | B2 * | 12/2002 | Nishizawa et al. | 257/723 |
| 7,345,361 | B2 * | 3/2008 | Mallik et al. | 257/686 |
| 7,576,433 | B2 * | 8/2009 | Ishino et al. | 257/777 |

* cited by examiner

*Primary Examiner*—Jasmine J Clark
(74) *Attorney, Agent, or Firm*—Brinks Hofer Gilson & Lione

(57) ABSTRACT

In a first embodiment, an apparatus and a method of fabrication thereof includes a substrate, a controller formed on a first integrated circuit (IC) die and disposed on the substrate, a second IC die embodying circuitry configured to enable communication between the controller and an external device, first I/O pads disposed on the first IC die, second I/O pads disposed on the second IC die, wire bonding interconnections coupling at least one of the first I/O pads with at least one of the second I/O pads, and a memory array formed on a third IC die and configured to enable communication with the controller. In a second embodiment the memory array is alternatively integrated into the first IC die.

16 Claims, 1 Drawing Sheet

US 7,898,091 B2

MULTI-HOST INTERFACE CONTROLLER WITH USB PHY/ANALOG FUNCTIONS INTEGRATED IN A SINGLE PACKAGE

TECHNICAL FIELD

The present disclosure relates generally to devices configurable to communicate over a plurality of different interfaces with an external host device. Such devices include electronic memory devices and the like.

BACKGROUND

Turning to FIG. 1, a conventional memory device 100 is illustrated in a system block diagram format. Such memory devices are typically used for applications such as digital camera image storage, music player music file storage (e.g., MP3s), storage ancillary to cellular telephones, non-volatile electronic memory storage for computing devices and servers, and the like. Such devices include a memory array 102 of individual memory cells (single-level or multi-level) where digital information may be stored, a memory interface 104 interfacing the memory array 102 to a memory controller 106, and one or more external interfaces (e.g., SD (Secure Digital) (108), USB (Universal Serial Bus) (112), PCMCIA, CF (Compact Flash), CF2 (110), MS (Memory Stick) and the like which are all well known to those of skill in the art) used for coupling the memory device 100 to another (external) device 114.

OVERVIEW

In a first embodiment, an apparatus and a method of fabrication thereof includes a substrate, a controller formed on a first integrated circuit (IC) die and disposed on the substrate, a second IC die embodying circuitry configured to enable communication between the controller and an external device, first I/O pads disposed on the first IC die, second I/O pads disposed on the second IC die, wire bonding interconnections coupling at least one of the first I/O pads with at least one of the second I/O pads, and a memory array formed on a third IC die and configured to enable communication with the controller. In a second embodiment the memory array is alternatively integrated into the first IC die.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

DESCRIPTION OF EXAMPLE EMBODIMENTS

Example embodiments are described herein in the context of a non-volatile memory (NVM) system configurable for use with a number of interfaces to communicate with a host device. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Memory devices, and, in particular Flash-type electrically erasable programmable read-only memory (FLASH EEPROM) devices are now commonly used as detachable memory in all sorts of products including many consumer electronics products such as digital cameras, personal computers, cellular telephones, music players and the like.

When manufacturing such memory devices, it is desirable to be able to build a minimum number of parts suitable for a maximum number of applications. For example, the memory array integrated circuit die will generally be commonly used among various implementations of the product. Where feasible, multiple external interfaces may be provided on the controller integrated circuit (IC) die. Where USB functionality is desired, a USB PHY is required along with analog circuitry such as a step down voltage converter/regulator (e.g., a low drop out linear regulator) to take standard 5 VDC power from the USB interface down to the level required (i.e., 3.3 VDC or less). Such circuits generate relatively large amounts of heat and signals which may interfere with signals in the controller and memory array (or vice versa).

Figure 1:
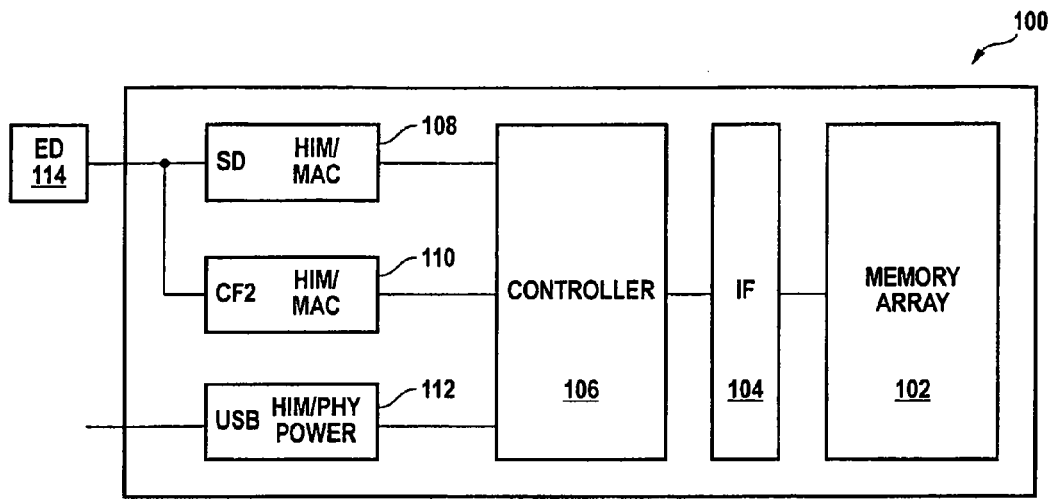
FIG. 1 illustrates a system block diagram of a conventional memory device.
Figure 2:
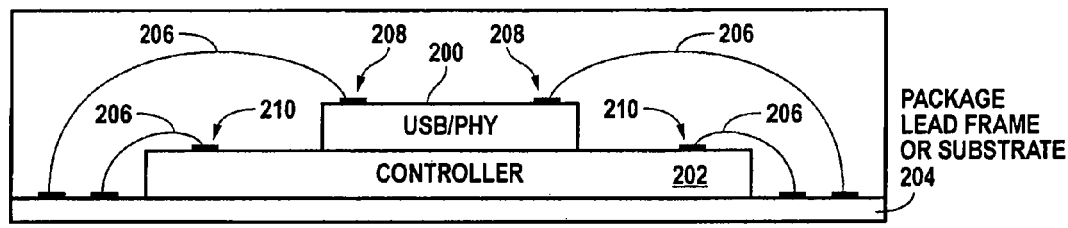
FIG. 2 illustrates a diagram showing attachment of a USB (universal serial bus) PHY (physical layer interface) device to a memory device controller in accordance with one embodiment of the present invention.

Turning now to FIG. 2, in one embodiment, a USB PHY and a voltage converter/regulator (analog circuitry) are produced on a first IC die 200. The controller and interface modules are produced on a second IC die 202. The memory array is produced on a third IC die (not shown in FIG. 2). Using multi-chip packaging technology the first (USB/PHY/Analog) 200 and second (Controller) 202 dies are integrated into a single package on a package lead frame or substrate 204. Wire bonding 206 may be used to couple signal I/O pins or pads 208 of the first die 202 with signal I/O pins or pads 210 of the second IC, generally via the package lead frame or substrate 204 as shown in FIG. 2.

Figure 3:
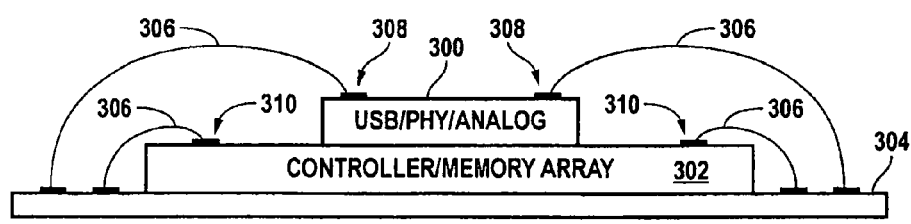
FIG. 3 illustrates a diagram showing attachment of a USB (universal serial bus) PHY (physical layer interface) device to a memory device controller and memory array in accordance with one embodiment of the present invention.

Turning now to FIG. 3, in a second embodiment, a USB PHY and a voltage converter/regulator (analog circuitry) are produced on a first IC die 300. The controller and interface modules are produced on a second IC die 302 along with the memory array. Using multi-chip packaging technology the first (USB/PHY/Analog) 300 and second (Controller/Memory) 302 dies are integrated into a single package on a package lead frame or substrate 304. Wire bonding 306 may be used to couple signal I/O pins or pads of the first die 308 with signal I/O pins or pads 310 of the second IC, generally via the package lead frame or substrate 304 as shown in FIG. 3.

These solutions have the advantage of reducing manufacturing costs in a high volume setting while adding costs in a lower volume setting. The net cost of the two configurations is lower compared to the cost of the fully integrated single chip solution. Where the By using a 12 signal UTMI+Low Pin Count (ULPI) interface known to those of skill in the art it is possible to configure the controller's I/O pins to support multiple modes of operation such as SD, MS and USB. The ULPI enables the Controller to be designed with few, if any, additional signal pins beyond what is needed for only the SD (Secure Digital) and MS (Memory Stick) interfaces. Where a USB interface is not required, the USB PHY may be omitted, reducing cost over an approach that requires a USB PHY be present even for SD and MS applications where it will not be used.

Other benefits of this approach (over fully integrating the entire memory device into a single integrated circuit die) include: (1) decoupling the semiconductor technology used in the PHY/Analog IC from the one used for the Controller IC (e.g., the analog circuitry can be implemented in 130 nm technology while the controller can be implemented in 90 nm technology); (2) power dissipation from the 5 VDC to 3.3 VDC regulator (Analog) and Controller is spread over two ICs instead of one, potentially providing improved thermal performance; and (3) since the PHY/Analog IC and the Controller IC are separate, they can be independently modified/upgraded.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. An apparatus comprising:
   a substrate;
   a controller formed on a first integrated circuit (IC) die and disposed on the substrate;
   a second IC die embodying interface circuitry configured to enable communication between the controller and a first type of external device;
   first I/O pads disposed on the first IC die;
   second I/O pads disposed on the second IC die;
   wire bonding interconnections coupling at least one of the first I/O pads with at least one of the second I/O pads; and
   a memory array formed on a third IC die and configured to communicate with the controller, wherein the wire bonding interconnections include signal interconnection paths disposed on the substrate.

2. The apparatus of claim 1, wherein the second IC die includes analog circuitry.

3. The apparatus of claim 1, wherein the second IC die includes a power converter.

4. The apparatus of claim 1, wherein the second IC die includes a voltage regulator.

5. The apparatus of claim 1, wherein the second IC die includes a voltage down-converter.

6. The apparatus of claim 1, wherein the second IC die includes a physical layer interface device (PHY).

7. The apparatus of claim 6, wherein the PHY is configured to support communications with an external device configured in accordance with one or more Universal Serial Bus standards.

8. The apparatus of claim 1, wherein the first IC die additionally includes an interface circuit configured to support data communications with a second type of external device at up to a first data rate and the interface circuitry of the second IC die is configured to support data communication with the first type of external device at speeds up to and exceeding the first data rate.

9. An apparatus comprising:
   a substrate;
   a controller and a memory array formed on a first integrated circuit (IC) die and configured to communicate with one another, the first die disposed on the substrate;
   a second IC die embodying circuitry configured to enable communication between the controller and a first external device;
   first I/O pads disposed on the first IC die;
   second I/O pads disposed on the second IC die; and
   wire bonding interconnections coupling at least one of the first I/O pads with at least one of the second I/O pads, wherein the wire bonding interconnections include signal interconnection paths disposed on the substrate.

10. The apparatus of claim 9, wherein the second IC die includes analog circuitry.

11. The apparatus of claim 9, wherein the second IC die includes a power converter.

12. The apparatus of claim 9, wherein the second IC die includes a voltage regulator.

13. The apparatus of claim 9, wherein the second IC die includes a voltage down-converter.

14. The apparatus of claim 9, wherein the second IC die includes a physical layer interface device (PHY).

15. The apparatus of claim 14, wherein the PHY is configured to support communications with an external device configured in accordance with one or more Universal Serial Bus standards.

16. The apparatus of claim 9, wherein the first IC die additionally includes an interface circuit configured to support data communications with a second type of external device at up to a first data rate and the interface circuitry of the second IC die is configured to support data communication with the first type of external device at speeds up to and exceeding the first data rate.

* * * * *